United States Patent [19]
McMeekin

[11] Patent Number: 5,872,814
[45] Date of Patent: Feb. 16, 1999

[54] METHOD FOR LINEARIZATION OF RF TRANSMISSION ELECTRONICS USING BASEBAND PRE-DISTORTION IN T/R COMPENSATION PILOT SIGNALS

[75] Inventor: Steven E. McMeekin, Woodinville, Wash.

[73] Assignee: AT&T Wireless Services Inc., Kirkland, Wash.

[21] Appl. No.: 804,615

[22] Filed: Feb. 24, 1997

[51] Int. Cl.[6] .............................. H04K 1/02; H04L 25/03; H04L 25/49

[52] U.S. Cl. ......................... 375/296; 375/296; 375/200; 375/202; 375/206; 375/208; 370/335; 370/342; 370/479

[58] Field of Search ...................................... 375/296, 200, 375/206, 208, 202; 370/335, 342, 332, 280, 281, 331, 479; 455/422, 436, 522

[56] References Cited

U.S. PATENT DOCUMENTS

| | | |
|---|---|---|
| 3,522,540 | 8/1970 | Lee . |
| 3,641,463 | 2/1972 | Perks . |
| 3,745,464 | 7/1973 | Lee . |
| 4,969,162 | 11/1990 | Karr ......................................... 375/230 |
| 5,161,044 | 11/1992 | Nazarathy et al. ...................... 359/157 |
| 5,253,272 | 10/1993 | Jaeger et al. ............................ 375/296 |
| 5,351,016 | 9/1994 | Dent ........................................ 332/103 |
| 5,574,990 | 11/1996 | Flanagan ................................. 455/115 |
| 5,673,290 | 9/1997 | Cioffi ...................................... 375/260 |
| 5,732,333 | 3/1998 | Cox et al. ............................... 455/126 |

*Primary Examiner*—Stephen Chin
*Assistant Examiner*—Michael W. Maddox

[57] ABSTRACT

An RF communications technique pre-distorts the signal in the baseband prior to its being applied to the RF transmitter, to avoid producing harmonics when the resultant signal is processed by the RF transmitter. Pilot tones are used to test the channels between the base station and a remote station. The technique provides an improved way to minimize the harmonic distortion imposed by RF transmitters.

12 Claims, 4 Drawing Sheets

METHOD FOR LINEARIZATION OF RF TRANSMISSION ELECTRONICS USING BASEBAND PRE-DISTORTION IN T/R COMPENSATION PILOT SIGNALS

CROSS-REFERENCES TO RELATED APPLICATIONS

The invention disclosed herein is related to the copending U.S. patent application by Siavash Alamouti, Doug Stolarz, and Joel Becker, entitled "VERTICAL ADAPTIVE ANTENNA ARRAY FOR A DISCRETE MULTITONE SPREAD SPECTRUM COMMUNICATIONS SYSTEM", Ser. No. 08/806,510, filed on the same day as the instant patent application, assigned to AT&T Wireless Services, and incorporated herein by reference.

The invention disclosed herein is related to the copending U.S. patent application by Alamouti, Michelson, et al., entitled "Method for Frequency Division Duplex Communications", Ser. No. 08/796,584, filed on Feb. 6, 1997, assigned to AT&T Wireless Services, and incorporated herein by reference.

The invention disclosed herein is related to the copending U.S. patent application by Elliott Hoole, entitled "TRANSMIT/RECEIVE COMPENSATION", Ser. No. 08/806,508, filed on the same day as the instant patent application, assigned to AT&T Wireless Services, and incorporated herein by reference.

The invention disclosed herein is related to the copending U.S. patent application by Gregory Veintimilla, entitled "METHOD TO INDICATE SYNCHRONIZATION LOCK OF A REMOTE STATION WITH A BASE STATION IN A DISCRETE MULTITONE SPREAD SPECTRUM COMMUNICATIONS SYSTEM", Ser. No. 08/804,617, filed on the same day as the instant patent application, assigned to AT&T Wireless Services, and incorporated herein by reference.

BACKGROUND OF THE INVENTION

1. Field of the Invention

This invention involves improvements to communications systems and methods in a wireless discrete multitone spread spectrum communications system.

2. Description of Related Art

Wireless communications systems, such as cellular and personal communications systems, operate over limited spectral bandwidths. They must make highly efficient use of the scarce bandwidth resource to provide good service to a large population of users. Code Division Multiple Access (CDMA) protocol has been used by wireless communications systems to efficiently make use of limited bandwidths. The protocol uses a unique code to distinguish each user's data signal from other users' data signals. Knowledge of the unique code with which any specific information is transmitted, permits the separation and reconstruction of each user's message at the receiving end of the communication channel.

The personal wireless access network (PWAN) system described in the referenced Alamouti, Stolarz, et al. patent application, uses a form of the CDMA protocol known as discrete multitone spread spectrum (DMT-SS) to provide efficient communications between a base station and a plurality of remote units. In this protocol, the user's data signal is modulated by a set of weighted discrete frequencies or tones. The weights are spreading codes that distribute the data signal over many discrete tones covering a broad range of frequencies. The weights are complex numbers with the real component acting to modulate the amplitude of a tone while the complex component of the weight acts to modulate the phase of the same tone. Each tone in the weighted tone set bears the same data signal. Plural users at the transmitting station can use the same tone set to transmit their data, but each of the users sharing the tone set has a different set of spreading codes. The weighted tone set for a particular user is transmitted to the receiving station where it is processed with despreading codes related to the user's spreading codes, to recover the user's data signal. For each of the spatially separated antennas at the receiver, the received multitone signals are transformed from time domain signals to frequency domain signals. Despreading weights are assigned to each frequency component of the signals received by each antenna element. The values of the despreading weights are combined with the received signals to obtain an optimized approximation of individual transmitted signals characterized by a particular multitone set and transmitting location. The PWAN system has a total of 2560 discrete tones (carriers) equally spaced in 8 MHZ of available bandwidth in the range of 1850 to 1990 MHZ. The spacing between the tones is 3.125 kHz. The total set of tones are numbered consecutively form 0 to 2559 starting from the lowest frequency tone. The tones are used to carry traffic messages and overhead messages between the base station and the plurality of remote units. The traffic tones are divided into 32 traffic partitions, with each traffic channel requiring at least one traffic partition of 72 tones.

In addition, the PWAN system uses overhead tones to establish synchronization and to pass control information between the base station and the remote units. A Common Link Channel (CLC) is used by the base to transmit control information to the Remote Units. A Common Access Channel (CAC) is used to transmit messages from the Remote Unit to the Base. There is one grouping of tones assigned to each channel. These overhead channels are used in common by all of the remote units when they are exchanging control messages with the base station.

In the PWAN system, Time Division Duplexing (TDD) is used by the base station and the remote unit to transmit data and control information in both directions over the same multi-tone frequency channel. Transmission from the base station to the remote unit is called forward transmission and transmission from the remote unit to the base station is called reverse transmission. The time between recurrent transmissions from either the remote unit or the base station is the TDD period. In every TDD period, there are four consecutive transmission bursts in each direction. Data is transmitted in each burst using multiple tones. The base station and each remote unit must synchronize and conform to the TDD timing structure and both the base station and the remote unit must synchronize to a framing structure. All remote units and base stations must be synchronized so that all remote units transmit at the same time and then all base stations transmit at the same time. When a remote unit initially powers up, it acquires synchronization from the base station so that it can exchange control and traffic messages within the prescribed TDD time format. The remote unit must also acquire frequency and phase synchronization for the DMT-SS signals so that the remote is operating at the same frequency and phase as the base station.

In the PWAN system, some of the tone frequencies are pilot tones used to transmit known symbol patterns from the base station to the remote or from the remote station to the base, to enable synchronization of the stations. The referenced Hoole and the referenced Veintimilla patent applications discuss some of these features.

One problem encountered in the prior art is the tendency of RF transmitters and related RF electronics to impose nonlinearities in processing signals. Typical RF systems have an input X and an output Y with an example transfer function Y=AX+BX2+CX3. There are both linear and non-linear portions of transfer function Y. The non-linear portion spreads the frequency band of the signals it processes into adjacent frequency bands. The non-linearities spread the signals in the frequency domain. Energy is put outside the band. This energy falls into the adjacent communications bands trying to share the same geographic cell site. For limited frequency band allocations such as the PCS spectrum, signals intended to be transmitted solely within the permitted frequency band are distorted by the RF transmitter, so that harmonic signals are radiated outside of the band. Since the PWAN system described in the referenced Alamouti, Stolarz, et al. patent application uses pilot tones to maintain synchronization between the stations, what is needed is a ay to utilize those pilot tones to minimize the harmonic distortion imposed by its RF transmitters.

SUMMARY OF THE INVENTION

The invention disclosed herein is a new technique to make the most efficient use of the scarce spectral bandwidth. The invention pre-distorts the signal in the baseband prior to its being applied to the RF transmitter, to avoid producing harmonics when the resultant signal is processed by the RF transmitter. The pilot tones used in the transmit/receive (T/R) compensation operation, are used to test the channels between the base station and a remote station. For example, pilot tones bearing a prearranged symbol pattern, are pre-distorted by a pre-distortion processor at the base station while the pilot tones are still in the baseband. The pre-distortion processor selects one of a plurality of graduated digital filtering algorithms to pre-distort the pilot tones in the baseband. Each of the graduated digital filtering algorithms can apply a progressively greater amount of pre-distortion to the pilot tones in the baseband. Initially, a relatively small amount of pre-distortion is applied to the pilot tones in the base band. The pre-distorted pilot tones are then transmitted in the forward channel by the RF transmitter at the base station to the remote receiving station. Any harmonic distortion of the transmitted pilot tones imposed by the RF transmitter at the base station are also transmitted to the remote receiving station.

At the remote receiving station, the received pilot tones with their harmonic distortion, are compared with the prearranged symbol pattern, analyzed, and an error signal is produced. The error signals the degree of severity of the harmonic distortion in the signals it has received. The remote station then encodes reverse channel pilot tones with the error information indicating the degree of severity of the harmonic distortion in the signals it has received. The reverse channel pilot tones are then transmitted back to the base station where they are used to control the pre-distortion processor. If the reverse channel pilot tones have been encoded by the remote station to indicate that a significant amount of harmonic distortion remains in the forward channel pilot tones, then the pre-distortion processor selects another one of the graduated digital filtering algorithms that will apply a progressively greater amount of pre-distortion to the pilot tones in the baseband. Then a relatively larger amount of pre-distortion is applied to the forward channel pilot tones in the base band. The pre-distorted pilot tones are then transmitted in the forward channel by the RF transmitter at the base station to the remote receiving station. This process continues until the remote station indicates in the encoded, reverse pilot tones that the harmonic distortion in the forward channel pilot tones is no longer significant. Thereafter, forward channel traffic from the base station to the remote station can be similarly pre-distorted in the baseband by the pre-distortion processor prior to transmission, to minimize harmonic distortion. The same process is carried out by the remote station that will pre-distort reverse channel pilot tones to minimize harmonic distortion. The resultant invention provides a way to utilize pilot tones to minimize the harmonic distortion imposed by RF transmitters.

Currently, the invention has advantageous applications in the field of wireless communications such as cellular communications or personal communications, where bandwidth is scarce compared to the number of the users and their needs. Such applications may be effected in mobile, fixed or minimally mobile systems. However, the invention may be advantageously applied to other, non-wireless, communications systems as well.

DESCRIPTION OF THE PREFERRED EMBODIMENT

Figure 1:
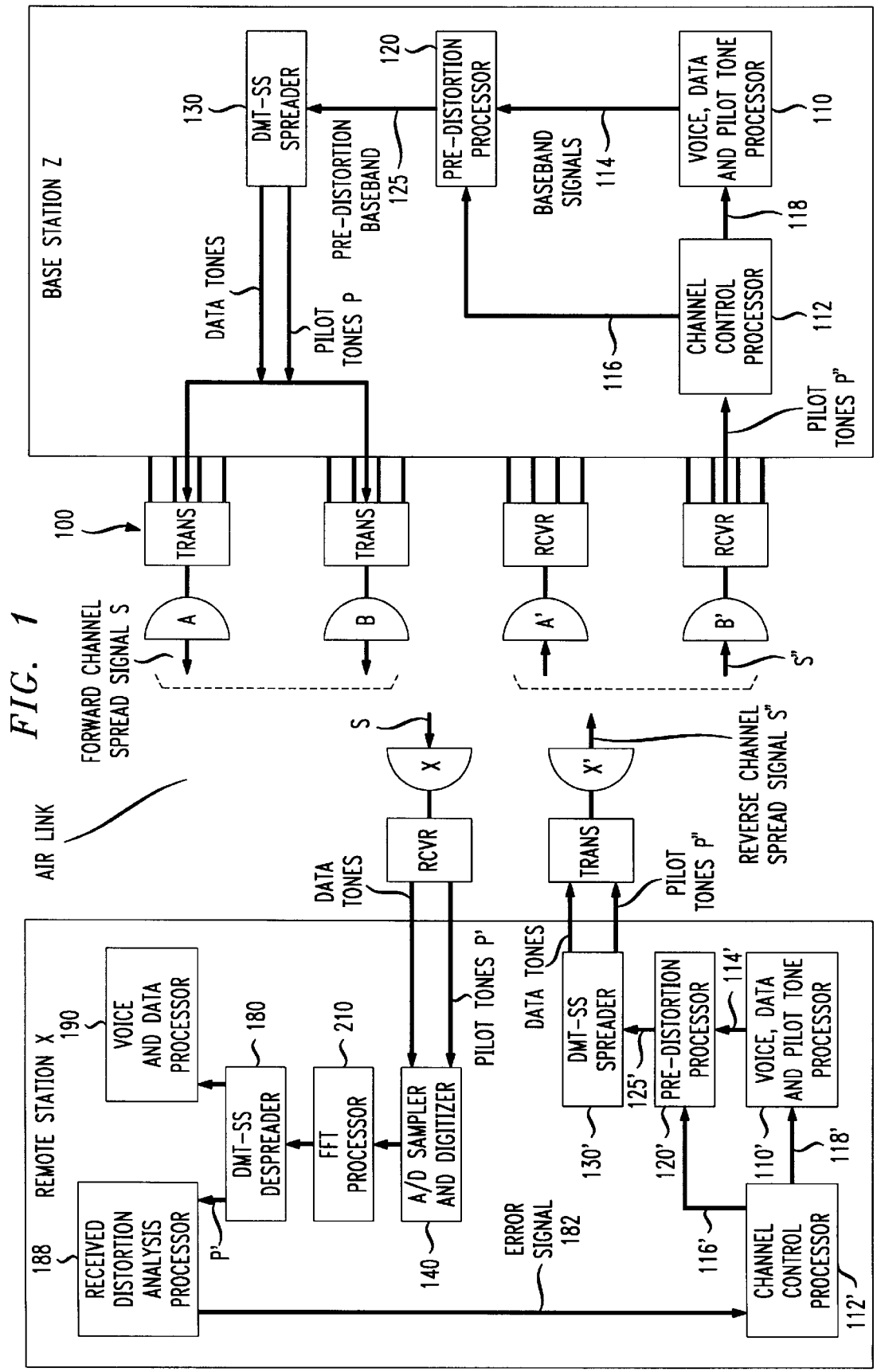
FIG. 1 is a block diagram showing an overview of the base station Z and the remote station X, in accordance with the invention.

FIG. 1 is a block diagram showing an overview of the base station Z and the remote station X, in accordance with the invention. The base station Z includes the voice, data, and pilot tone processor 110, the channel control processor 112, the pre-distortion processor 120, the DMT-SS spreader 130, RF transmitters 100, RF receivers, and antenna array A/A' and B/B'.

The invention uses the pre-distortion processor 120 to pre-distort either voice, data, or pilot tone signals output from the voice, data, and pilot tone processor 110 on line 114 in the baseband prior to its being applied by the DMT-SS spreader 130 to the RF transmitter 100, to avoid producing harmonics when the resultant signal is processed by the RF transmitter 100. The pilot tones used in the transmit/receive (T/R) compensation operation, are used to test the channels between the base station and a remote station.

Figure 2:
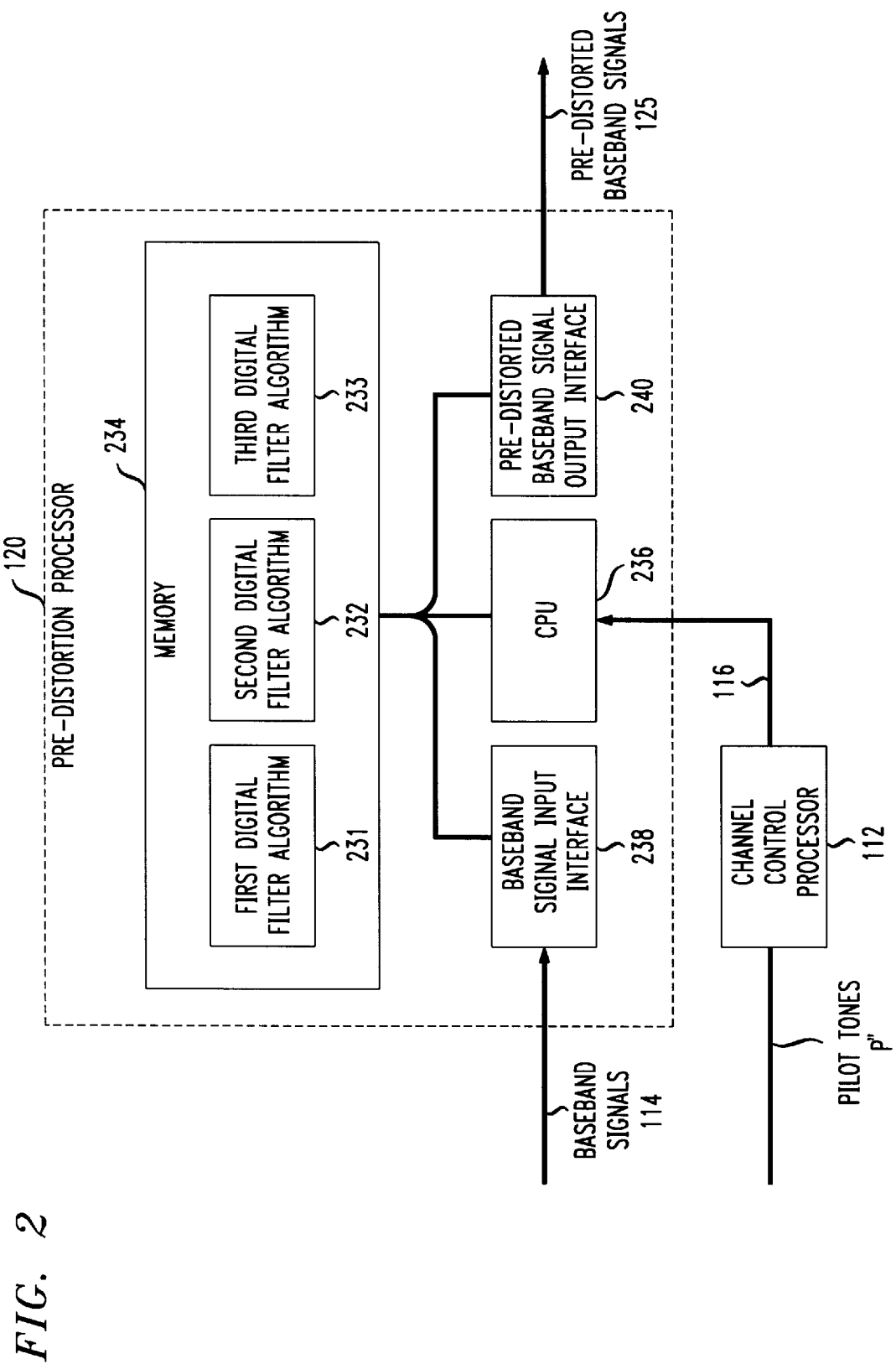
FIG. 2 shows a block diagram of the pre-distortion processor 120 in the base station, in accordance with the invention.

For example, pilot tones on line 114 bearing a prearranged symbol pattern (as in the referenced Veintimilla patent application), are pre-distorted by the pre-distortion processor 120 at the base station while the pilot tones are still in the baseband. FIG. 2 shows a block diagram of the pre-distortion processor 120 in the base station, in accordance with the invention. The pre-distortion processor 120 includes a memory 234 connected by the bus 235 to the CPU 236, the baseband signal input interface 238, and the pre-distorted baseband signal output interface 240. Voice, data, or forward channel pilot signals are input on line 114 to interface 238. Pre-distorted baseband voice, data, or forward channel pilot signals are output on line 125 from interface 240. The memory 234 includes a first digital filter algorithm, 231, a second digital filter algorithm, 232, and a third digital filter algorithm, 233. Algorithms 231, 232, and 233 are graduated digital filtering algorithms to pre-distort the voice signals, data signals, or forward channel pilot tones in the baseband. Each of the graduated digital filtering algorithms 231, 232, and 233 can apply a progressively greater amount of pre-distortion to the voice, data, or forward channel pilot tones in the baseband.

Figure 4:
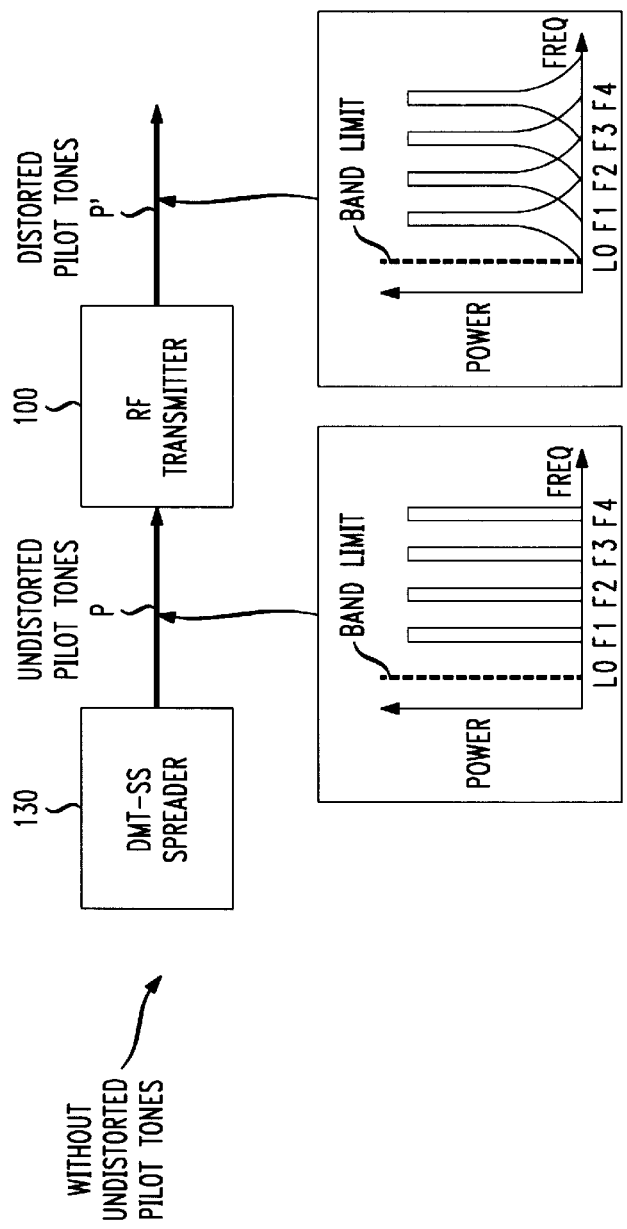
FIG. 4 shows the transformation of pilot tones without pre-distortion in the baseband, when they are processed by the RF transmitter.

The pre-distortion processor 120 selects one of the plurality of graduated digital filtering algorithms 231, 232, or 233 to pre-distort the forward channel pilot tones input on line 114 in the baseband. FIG. 4 shows the transformation of pilot tones without pre-distortion in the baseband, when they are processed by the RF transmitter. Initially, a relatively small amount of pre-distortion is applied to the pilot tones in the base band by selecting digital filtering algorithm 231. The selection of which algorithm 231, 232, or 233 is to be executed by the CPU 236 is done by the CPU 236 in response to the channel control processor 112 which provides an error signal in the reverse channel pilot tones P''', as will be discussed below.

The pre-distorted pilot tones P are then transmitted in the forward channel by the RF transmitter 100 at the base station to the remote receiving station. The RF transmitter 100 distorts the pilot tones, producing the distorted pilot tones P' which are received at the remote station X. FIG. 1 shows the remote station X, in accordance with the invention. Any harmonic distortion of the transmitted pilot tones P imposed by the RF transmitter 100 at the base station Z are also transmitted in pilot tones P' to the remote receiving station X. Antenna X receives pilot tones P' in the spread signal S over the air link, and applies them to the receiver and the A/D sampler and digitizer 140. The pilot tones P' are processed by the FFT processor 210 and the DMT-SS despreader 180 and are applied to the received distortion analysis processor 188. See the referenced Veintimilla patent application for a description of these features.

Figure 3:
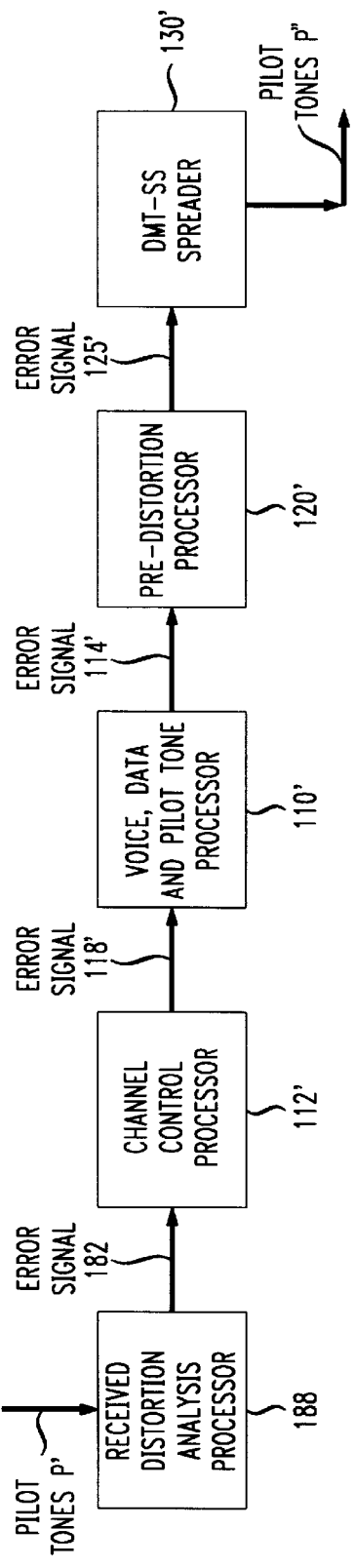
FIG. 3 shows the processing flow to analyze the received, forward channel pilot tones P', generate an error signal, and generate reverse channel pilot tones P" in the remote station, in accordance with the invention.

FIG. 3 shows the processing flow to analyze the received, forward channel pilot tones P', generate an error signal, and generate reverse channel pilot tones P''' in the remote station, in accordance with the invention. At the remote receiving station, the received pilot tones P' with their harmonic distortion, are compared in the analysis processor 188 with the prearranged symbol pattern, analyzed, and an error signal is produced on line 182. The error signal on line 182 indicates the degree of severity of the harmonic distortion in the pilot tone P' signals it has received. The channel control processor 112' in the remote station encodes a reverse channel pilot tone P''' with the error information on line 182, indicating the degree of severity of the harmonic distortion in the signals remote station X has received. The reverse channel pilot tones P''' are then transferred on line 118' through the voice, data, and pilot tone processor 110' and on line 114' through the pre-distortion processor 120', and on line 125' through the DMT-SS spreader 130' to the transmitter and antenna X' of the remote station. The reverse channel pilot tones P''' are formed into the spread signal S''' and transmitted over the air link to the base station Z.

Figure 5:
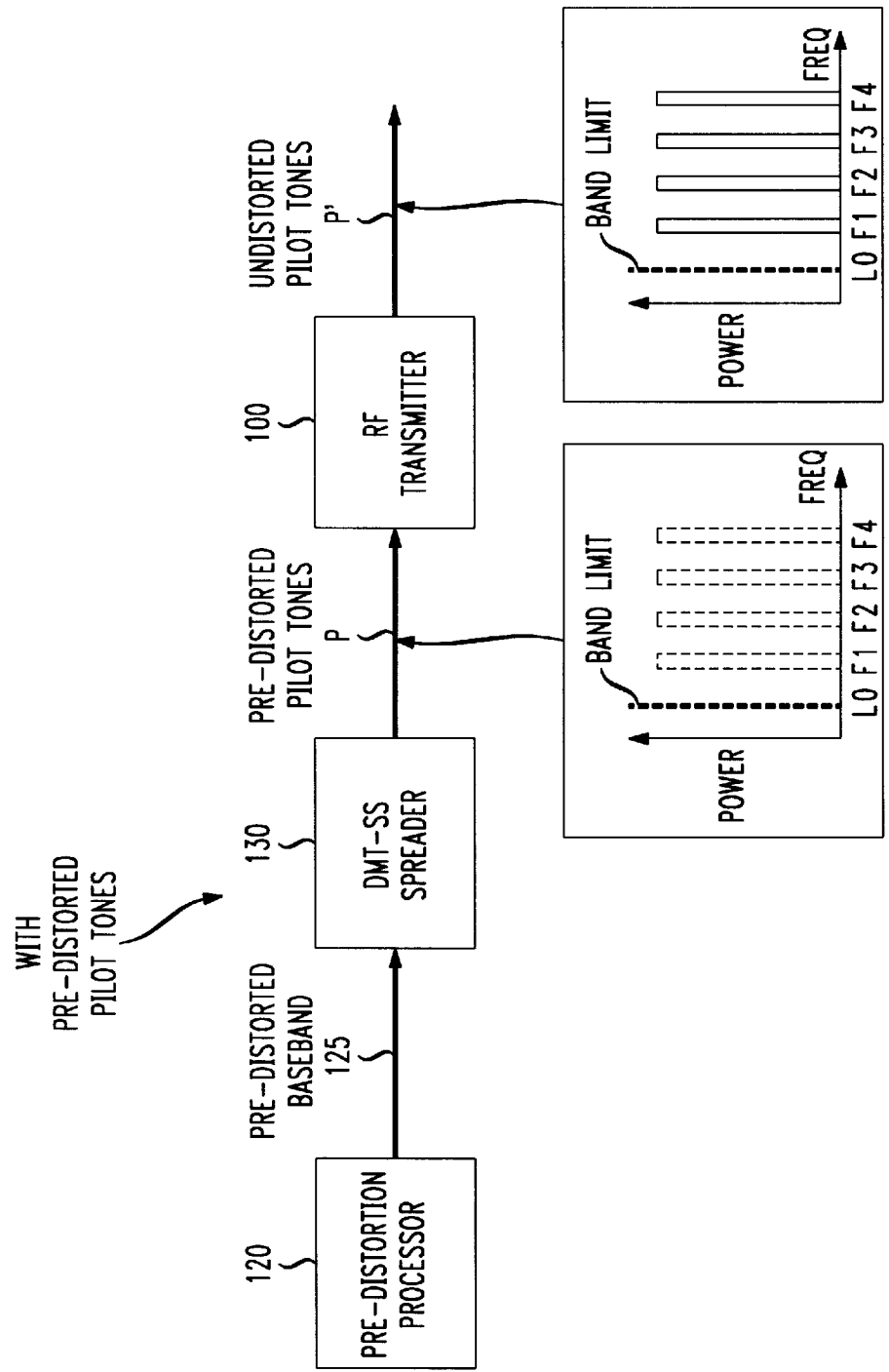
FIG. 5 shows the transformation of pilot tones with pre-distortion in the baseband by the pre-distortion processor 120, when the pre-distorted pilot tones are processed by the RF transmitter, in accordance with the invention.

The reverse channel pilot tones P''' transmitted back to the base station Z, are used to control the pre-distortion processor 120 at the base station. FIG. 1 shows the reverse channel pilot tones P''' applied to the channel control processor 112 which produces a control signal on line 116 to the pre-distortion processor. An enabling signal is also output from the channel control processor 112 over line 118 to the voice, data, and pilot tone processor 110 to initiate generation of another copy of the prearranged symbol pattern that is applied over line 114 to the pre-distortion processor 120. If the reverse channel pilot tones P''' have been encoded by the remote station X to indicate that a significant amount of harmonic distortion remains in the forward channel pilot tones P', then the pre-distortion processor 120 shown in FIG. 2, selects another one of the graduated digital filtering algorithms 232 that will apply a progressively greater amount of pre-distortion to the prearranged symbol pattern of the new copy of the pilot tones being generated by the processor 110 in the baseband. Then a relatively larger amount of pre-distortion is applied by pre-distortion processor 120 to the new copy of the forward channel pilot tones generated by processor 110 in the base band. The pre-distorted new copy of the pilot tones are then transmitted in the forward channel by the RF transmitter 100 at the base station to the remote receiving station. This process continues until the remote station indicates in the encoded, reverse pilot tones P''' that the harmonic distortion in the forward channel pilot tones P' is no longer significant. Thereafter, forward channel traffic from the base station to the remote station can be similarly pre-distorted in the baseband by the pre-distortion processor 120 prior to transmission, to minimize harmonic distortion. FIG. 5 shows the transformation of pilot tones with pre-distortion in the baseband by the pre-distortion processor 120, when the pre-distorted pilot tones are processed by the RF transmitter, in accordance with the invention. The resultant invention provides a way to utilize pilot tones to minimize the harmonic distortion imposed by RF transmitters.

The same process is carried out by the remote station X that will pre-distort reverse channel pilot tones to minimize harmonic distortion.

Still another alternate embodiment applies the above described invention in the PWAN Frequency Division Duplex Communications System described in the Alamouti, Michaelson et al. patent application cited above.

Although the preferred embodiments of the invention have been described in detail above, it will be apparent to those of ordinary skill in the art that obvious modifications may be made to the invention without departing from its spirit or essence. Consequently, the preceding description should be taken as illustrative and not restrictive, and the scope of the invention should be determined in view of the following claims.

What is claimed is:

1. A highly bandwidth-efficient communications method to minimize harmonic distortion imposed by RF equipment, comprising the steps of:

generating pilot tones bearing a prearranged symbol pattern at a first station;

pre-distorting said pilot tones with a pre-distortion processor at the first station while the pilot tones are in a baseband;

said pre-distorting step including selecting one of a plurality of digital filtering algorithms to predistort the pilot tones in the baseband, each of the digital filtering algorithms applying a progressively greater amount of pre-distortion to the pilot tones in the baseband;

initially applying a relatively small amount of pre-distortion to the pilot tones in the base band;

transmitting the pre-distorted pilot tones in a first channel by an RF transmitter at the first station to a second, receiving station, the transmitted pilot tones including harmonic distortion imposed by the RF transmitter at the first station;

receiving at the second receiving station the pilot tones with their harmonic distortion;

comparing the received pilot tones with the prearranged symbol pattern, and generating an error signal indicating a degree of severity of the harmonic distortion in the pilot tone signals;

sending the error signal from the second station to the first station;

controlling the pre-distortion processor at the first station in response to the error signal, to select another one of the plurality of digital filtering algorithms that will apply a progressively greater amount of pre-distortion to pilot tones in the baseband; and continuing the above steps until the second station indicates that the harmonic distortion in the first channel pilot tones is no longer significant.

2. In the highly bandwidth-efficient communications method of claim 1, further comprising:

said first station is a base station and said second station is a remote station.

3. In the highly bandwidth-efficient communications method of claim 1, further comprising:

said first station is a remote station and said second station is a base station.

4. The highly bandwidth-efficient communications method of claim 1, wherein said first station and said second station are part of a wireless discrete multitone spread spectrum communications system.

5. A highly bandwidth-efficient communications method, comprising the steps of:

receiving at a base station during a first time period a first spread signal comprising a first data signal spread over a plurality of discrete tones;

adaptively despreading the signal received at the base station by using despreading codes that are based on the characteristics of the received spread signal;

spreading a second data signal at the base station with spreading codes, that distributes the second data signal over a plurality of discrete tones, forming a second spread signal;

pre-distorting the second spread signal in the baseband by a first amount using a first digital filtering algorithm to avoid producing harmonics when the resultant signal is transmitted;

transmitting said second spread signal during a second time period;

receiving at the base station during a third time period a third spread signal comprising an error signal derived from said pre-distorted second spread signal;

pre-distorting a fourth spread signal in the baseband by a second amount using a second digital filtering algorithm in response to said error signal, to avoid producing harmonics when the resultant signal is transmitted; and transmitting said fourth spread signal during a fourth time period.

6. The highly bandwidth-efficient communications method of claim 5, which further comprises:

linearizing RF equipment in said base station using a compensation value derived from said pre-distorting steps.

7. A highly bandwidth-efficient communications system to minimize harmonic distortion imposed by RF equipment, comprising:

means for generating pilot tones bearing a prearranged symbol pattern at a first station;

means for pre-distorting said pilot tones with a pre-distortion processor at the first station while the pilot tones are in a baseband;

means for selecting one of a plurality of digital filtering algorithms to pre-distort the pilot tones in the baseband, each of the digital filtering algorithms applying a progressively greater amount of pre-distortion to the pilot tones in the baseband;

means for initially applying a relatively small amount of pre-distortion to the pilot tones in the base band;

means for transmitting the pre-distorted pilot tones in a first channel by an RF transmitter at the first station to a second, receiving station, the transmitted pilot tones including harmonic distortion imposed by the RF transmitter at the first station;

means for receiving at the second receiving station the pilot tones with their harmonic distortion;

means for comparing the received pilot tones with the prearranged symbol pattern, and generating an error signal indicating a degree of severity of the harmonic distortion in the pilot tone signals;

means for sending the error signal from the second station to the first station;

means for controlling the pre-distortion processor at the first station in response to the error signal, to select another one of the plurality of digital filtering algorithms that will apply a progressively greater amount of pre-distortion to pilot tones in the baseband; and means at the second station for indicating that the harmonic distortion in the first channel pilot tones is no longer significant.

8. In the highly bandwidth-efficient communications system of claim 7, further comprising:

said first station is a base station and said second station is a remote station.

9. In the highly bandwidth-efficient communications system of claim 7, further comprising:

said first station is a remote station and said second station is a base station.

10. The highly bandwidth-efficient communications system of claim 7, wherein said first station and said second station are part of a wireless discrete mutilation spread spectrum communications system.

11. A highly bandwidth-efficient communications system, comprising:

means for receiving at a base station during a first time period a first spread signal comprising a first data signal spread over a plurality of discrete tones;

means for adaptively despreading the signal received at the base station by using despreading codes that are based on the characteristics of the received spread signal;

means for spreading a second data signal at the base station with spreading codes, that distributes the second data signal over a plurality of discrete tones, forming a second spread signal;

means for pre-distorting the second spread signal in the baseband by a first amount using a first digital filtering algorithm to avoid producing harmonics when the resultant signal is transmitted;

means for transmitting said second spread signal during a second time period;

means for receiving at the base station during a third time period a third spread signal comprising an error signal derived from said pre-distorted second spread signal;

means for pre-distorting a fourth spread signal in the baseband by a second amount using a second digital filtering algorithm in response to said error signal. to avoid producing harmonics when the resultant signal is transmitted; and means for transmitting said fourth spread signal during a fourth time period.

12. The highly bandwidth-efficient communications system of claim 11, which further comprises:

means for linearizing RF equipment in said base station using a compensation value derived from said pre-distorting means.

* * * * *